(12) United States Patent
Dabral et al.

(10) Patent No.: US 6,922,071 B2
(45) Date of Patent: Jul. 26, 2005

(54) SETTING MULTIPLE CHIP PARAMETERS USING ONE IC TERMINAL

(75) Inventors: Sanjay Dabral, Palo Alto, CA (US); Santanu Chaudhuri, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 196 days.

(21) Appl. No.: 10/330,598

(22) Filed: Dec. 27, 2002

(65) Prior Publication Data

US 2004/0124875 A1 Jul. 1, 2004

(51) Int. Cl.$^7$ ............................................. H03K 17/16
(52) U.S. Cl. ............................. 326/26; 326/30; 326/82
(58) Field of Search .............................. 326/21–27, 30, 326/82, 83, 89

(56) References Cited

U.S. PATENT DOCUMENTS

| | | | | |
|---|---|---|---|---|
| 5,532,616 A | * | 7/1996 | Keeney ........................ | 326/30 |
| 5,729,154 A | * | 3/1998 | Taguchi et al. ............... | 326/30 |
| 6,556,039 B2 | * | 4/2003 | Nagano et al. ................ | 326/30 |
| 6,603,329 B1 | * | 8/2003 | Wang et al. ................... | 326/30 |
| 6,642,741 B2 | * | 11/2003 | Metz et al. .................... | 326/30 |

OTHER PUBLICATIONS

Poulton, John, "A Tracking Clock Recovery Receiver for 4–GBPS Signaling," IEEE, Jan./Feb. 1998, pp. 25–27.
Yang, Chih–Kong Ken, et al., "A 0.5–$\mu$m CMOS 4.0–Gbit/s Serial Link Transceiver with Data Recovery Using Oversampling," IEEE Journal of Solid–State Circuits, vol. 33, No. 5, May 1998, pp. 713–722.
Farjjad–Rad, Ramin, et al., "A 0.3–$\mu$m CMOS 8–Gb/s 4–PAM Serial Link Transceiver," IEEE Journal of Solid–State Circuits, vol. 35, No. 5, May 2000, pp. 757–764.
Farjjad–Rad, Ramin, et al., "A 0.4–$\mu$m CMOS 10–Gb/s 4–PAM Pre–Emphasis Serial Link Transmitter," IEEE Journal of Solid–State Circuits, vol. 34, No. 5, May 1999, pp. 580–585.

* cited by examiner

*Primary Examiner*—Don Le
(74) *Attorney, Agent, or Firm*—Blakely, Sokoloff, Taylor & Zafman LLP

(57) ABSTRACT

A method for setting multiple chip parameters using one IC terminal is described. The chip comprises a first circuit coupled to the pin for setting a first parameter. A second circuit coupled to the pin sets a second parameter. In addition, a third circuit coupled to the pin sets a third parameter of the chip.

24 Claims, 5 Drawing Sheets

SETTING MULTIPLE CHIP PARAMETERS USING ONE IC TERMINAL

FIELD OF THE INVENTION

The present invention pertains to the field of integrated circuit design. More particularly, the present invention relates to a method to improve cost efficiency by conserving integrated circuit terminals.

BACKGROUND OF THE INVENTION

Integrated circuit (IC) terminals are used to transfer input and output signals to and from a chip. These input and output signals may include data, clock signals, and power terminals. Moreover, signals used to control impedance, termination, slew rate, equalization, voltage swing, and reference voltages on the IC may be set and monitored through the IC terminals.

Packaging bumps or pins are examples of IC terminals. Whether bumps or pins are implemented depends primarily on the packaging technology chosen. Regardless of which packaging technology implemented, each IC terminal is typically used to set only one parameter of the IC. For example, a programming resistor that sets the impedance of a driver may be set using a pin. Another pin may be used to set a reference voltage for a differential receiver.

BRIEF DESCRIPTION OF THE DRAWINGS

The embodiments of the present invention are illustrated by way of example and not in the figures of the accompanying drawings, in which like references indicate similar elements and in which.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
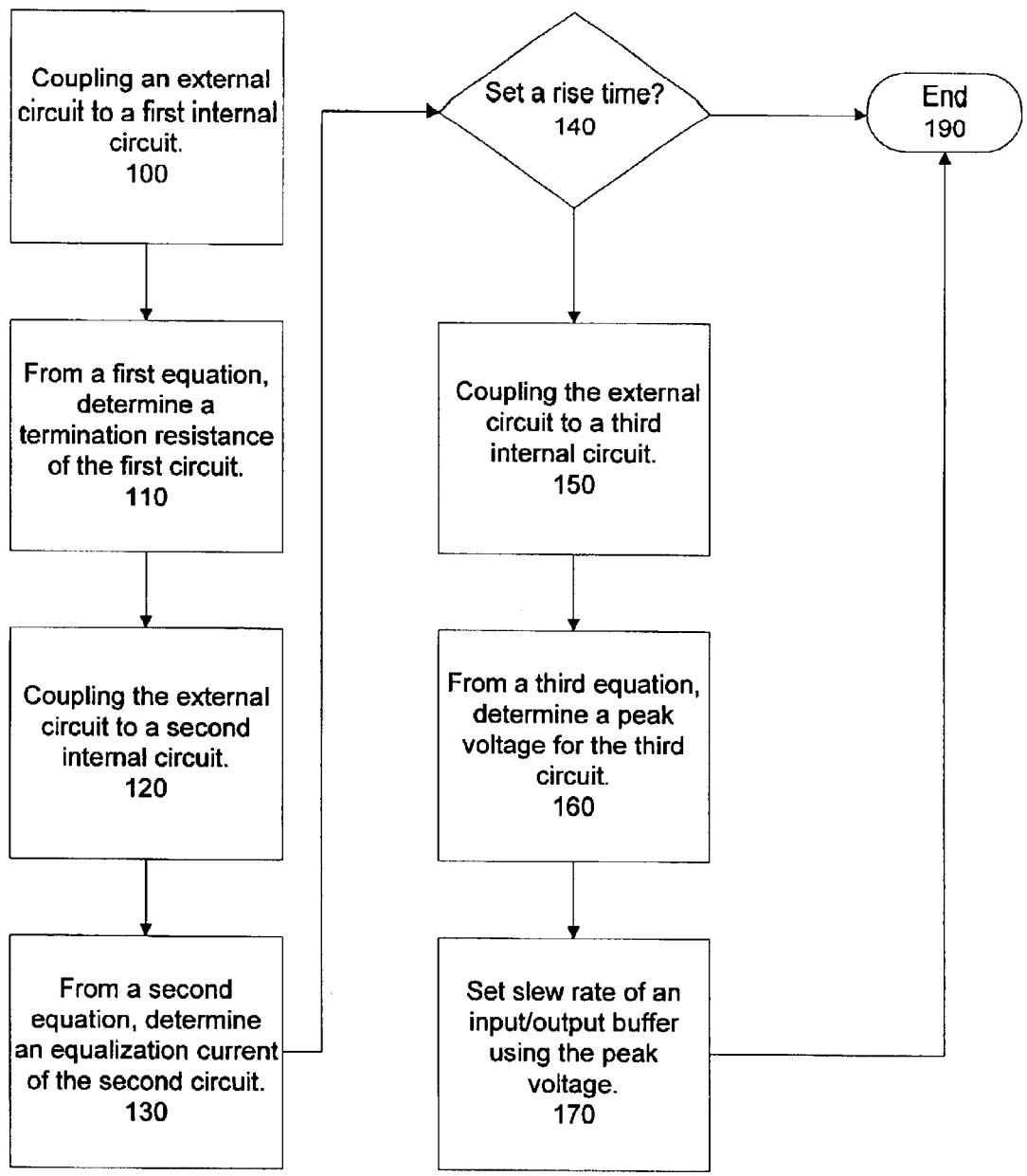
FIG. 1 shows a flowchart for setting multiple voltages on an integrated circuit.

A method that allows a user to set multiple parameters of an IC through a single IC terminal helps to reduce costs by minimizing the number of required IC terminals. If the IC terminals are predetermined, the ability to set multiple parameters using a single IC terminal enables more parameters of the IC to be adjusted for circuit improvements. For one embodiment of the invention, FIG. 1 shows a flowchart for setting multiple variables using a single pin. In operation 100, a first internal circuit on an IC is coupled to an external circuit. The first circuit will be described in further detail below and in FIG. 3. The external circuit may be a voltage source coupled to a voltage divider that comprises a first resistor and a second resistor. The external circuit may provide the first circuit with an input voltage. From the measured input voltage and the known values of the first and second resistors, the first circuit uses a first equation to calculate and set a first parameter in operation 110. The first parameter may be a termination resistance.

Next, in operation 120, a logic circuit or switch on the IC may be used to couple a second internal circuit to the external circuit. The second circuit will be described in further detail below and in FIG. 4. The external circuit may provide the second circuit with an input voltage. From the measured input voltage and the known values of the first and second resistors, the second circuit uses a second equation to calculate and set a second parameter in operation 130. The second parameter may be an equalization current.

Operation 140 determines if the user wishes to set a third parameter of the IC. If the user does not wish to set a third parameter, the process is terminated in operation 190. Otherwise, operation 150 couples a third internal circuit of the IC to the external circuit. For this embodiment, a capacitor and a third resistor may be added to the existing voltage divider structure. The third circuit will be described in further detail below and in FIG. 5. The external circuit may provide the third circuit with an input voltage. Using the measured input voltage and the known values of the first, second, and third resistors, the third circuit uses a third equation to calculate a variable in operation 160. The variable may be a peak voltage value of the third circuit. The detected peak voltage may be converted to a digital number using a translation circuitry such as an analog-to-digital (A/D) converter. A third parameter may then be set in operation 170 using the digital number generated by the A/D converter. For example, the digital number may set a slew rate (rise time) of an input/output (I/O) buffer. The I/O buffer may have a plurality of drivers of different sizes. The slew rate setting of the I/O buffer may be adjusted by turning on drivers of a specific size. Thus, the slew rate setting of the I/O buffer depends on which drivers are turned on by the digital number. Finally, the process is terminated in operation 190.

Because the external circuit is comprised of linear elements, the external circuit may be represented as a Thevenin voltage and resistance for DC operation. The external circuit and the internal circuits form a linear network. Therefore, two variables may be used to set two parameters. By measuring the network in two DC configurations, the values of the Thevenin voltage and resistance may be observed. The first configuration may be achieved by operation 100 when the external circuit is coupled to the first circuit. The first circuit operated in open circuit mode may provide the Thevenin voltage. The second situation may be achieved by operation 120 when the external circuit is coupled to the second circuit. The second circuit operated in continuity mode may provide the Thevenin resistance. The derivations for the two parameters are described in further detail below.

To measure a third variable for setting a third parameter, an AC signal may be applied to the linear network. Any capacitively coupled path functions as an open circuit for DC signals. The third variable may be an effective Thevenin impedance when the AC signal is applied. The derivation for the third parameter is described in further detail below in equation For another embodiment of the invention, the external circuit used to set the first, the second, and the third parameters of FIG. 1 are coupled to the first, the second, and the third circuits through a packaging bump rather than a pin.

Figure 2:
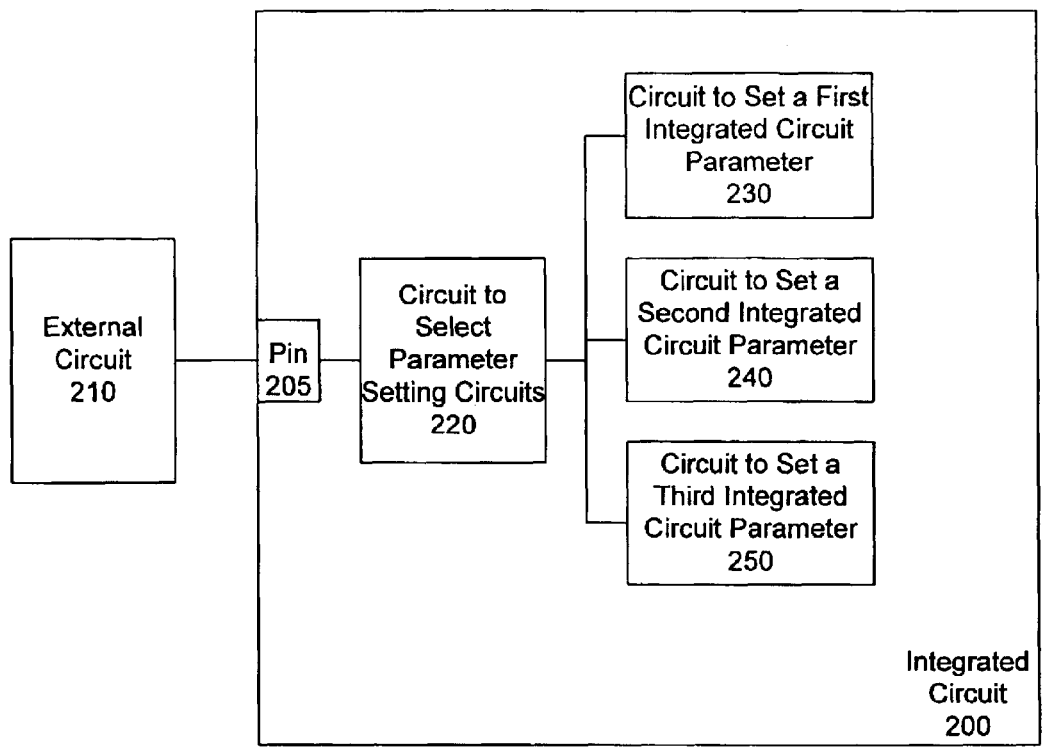
FIG. 2 shows on embodiment of a system for setting multiple chip parameters using a single IC terminal.

FIG. 2 depicts a system for setting multiple variables of an IC 200 using a single IC terminal. The system comprises an external circuit 210, a circuit to select parameter setting circuits 220, a first parameter setting circuit 230, a second parameter setting circuit 240, and a third parameter setting circuit 250. Circuit 230, circuit 240, and circuit 250 are used for setting a first, a second, and a third parameter of the IC. External circuit 210 is used to provide an input to circuit 230, circuit 240, and circuit 250. The external circuit 210 is coupled to the IC 200 through a single pin 205. Depending on the packaging technology of the chip, pin 205 may be implemented as a bump.

Circuit 220 initially couples the external circuit 210 to the circuit 230 to set the first parameter. After the first parameter has been set, circuit 220 then couples the external circuit 210 to circuit 240 to set the second parameter. After the second parameter is set, circuit 220 then couples the external circuit 210 to circuit 250 to set the third parameter.

For one embodiment of the invention, circuit 220 is a decoder. For another embodiment of the invention, circuit 220 is a counter. For yet another embodiment of the invention, circuit 220 is a multiplexer.

For another embodiment of the invention, a first internal circuit may be used to set the first and second parameters and a second internal circuit may be used to set the third parameter. For yet another embodiment of the invention, a first internal circuit may be used to set the first, second, and third parameters.

Figure 3:
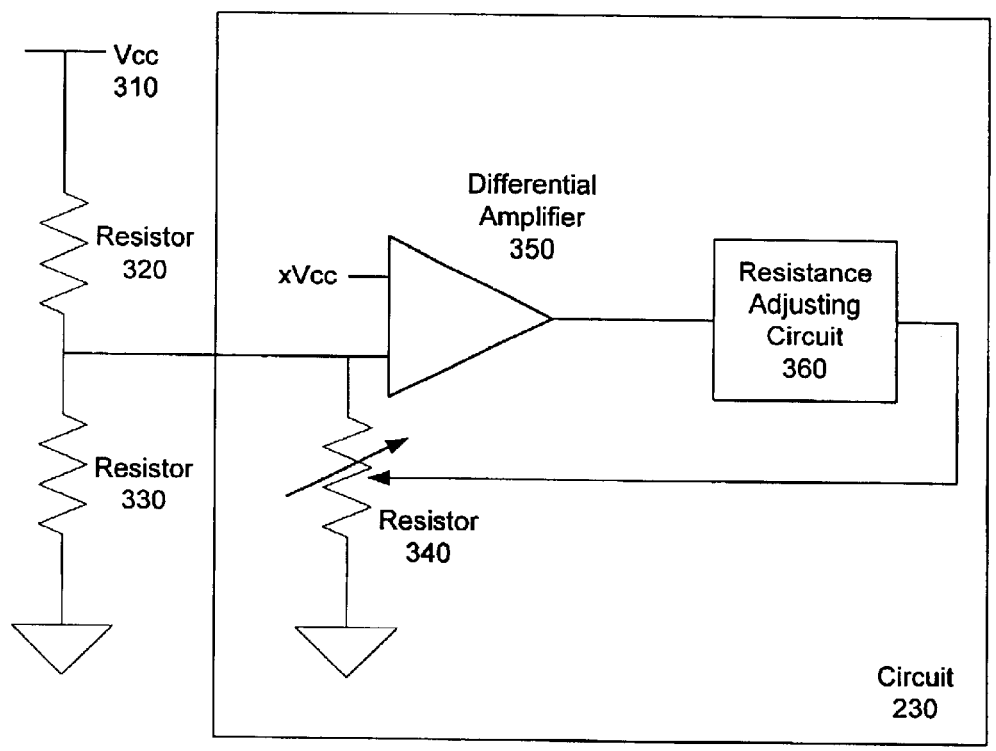
FIG. 3 shows one embodiment of a circuit for setting a first parameter.

FIG. 3 depicts an embodiment of the circuit 230 for setting a first parameter of IC 200. The circuit 230 comprises a differential amplifier 350, a termination resistor 340, and a circuit 360 for adjusting the termination resistor based upon the output of the differential amplifier 350. The differential amplifier compares an input voltage with a reference voltage, xVcc. The input voltage is obtained from an external circuit such as a voltage divider comprising a DC voltage source (Vcc) 310, resistor 320, and resistor 330. The value of the input voltage is a function of Vcc 310, resistor 320, resistor 330, and resistor 340.

The magnitude of reference voltage, xVcc, may be a fraction of Vcc 310. The circuit 360 calculates and sets the termination resistor 340 such that the voltage drop across the termination resistor 340 is approximately equal to xVcc. The following equation expresses the relationship between the voltage drop across the termination resistor 340 and xVcc, wherein resistor 320 is R1, resistor 330 is R2, and resistor 340 is RT:

$$\left(\frac{R2\|RT}{R1 + R2\|RT}\right)Vcc = xVcc. \qquad \text{Equation 1}$$

Because the values for R1, R2, Vcc, and xVcc are known, RT is the only unknown variable and may be readily solved. Note that in order for circuit 230 to function as a linear circuit, the termination resistor 340 may be limited to a range of possible values defined by resistors 320 and 330. Prior to circuit implementation, the range may be predetermined by tests or simulations across different processes, temperatures, or voltages.

Figure 4:
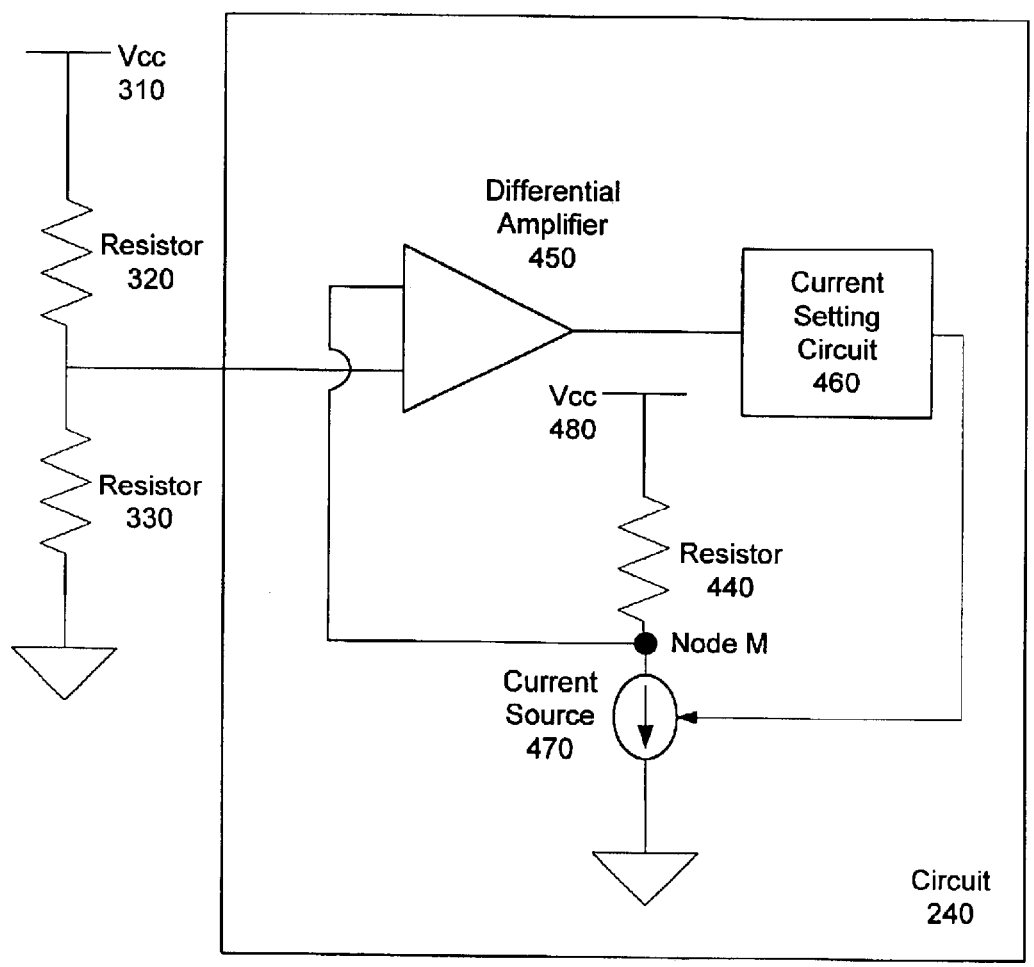
FIG. 4 shows one embodiment of a circuit for setting a second parameter.

FIG. 4 depicts an embodiment of a circuit 240 for setting a second parameter of IC 200. The circuit 240 comprises a differential amplifier 450, a DC voltage source (Vcc) 480, a resistor 440, a current source 470, and a circuit 460 for calculating and setting the current source 470.

The resistor 440 is coupled to Vcc 480 and current source 470. The resistance of resistor 440 is approximately equal or a known fraction to the resistance of termination resistor 340 of circuit 230. Thus, a proper setting of termination resistor 340 also sets the resistor 440. The equalization current of the current source 470 is determined by circuit 460. The circuit 460 is coupled to the differential amplifier 450, which compares an input voltage with the voltage value at node M. The input voltage may be created by an external circuit. For example, the external circuit may comprise Vcc 310, resistor 320, and resistor 330. For this embodiment of the invention, Vcc 310 is approximately equal to Vcc 480. The output of differential amplifier 450 is coupled to the circuit 460. Circuit 460 sets the current source 470 such that the voltage drop at node M is approximately equal to the input voltage provided by the external circuit. Therefore, the following equation may be derived, wherein resistor 320 is R1, resistor 330 is R2, resistor 440 is RT, and the equalization current across current source 470 is Ieq:

$$\left(\frac{R2}{R1 + R2}\right)Vcc = (Vcc - RT * Ieq). \qquad \text{Equation 2}$$

RT was previously calculated in equation 1. Because the values for R1, R2, Vcc, and RT are known, Ieq is the only unknown variable and may be readily solved. The constraint of RT, as previously discussed, may be alternatively described by the equation:

$$RT*Ieq < Vcc - xVcc. \qquad \text{Equation 3}$$

Figure 5:
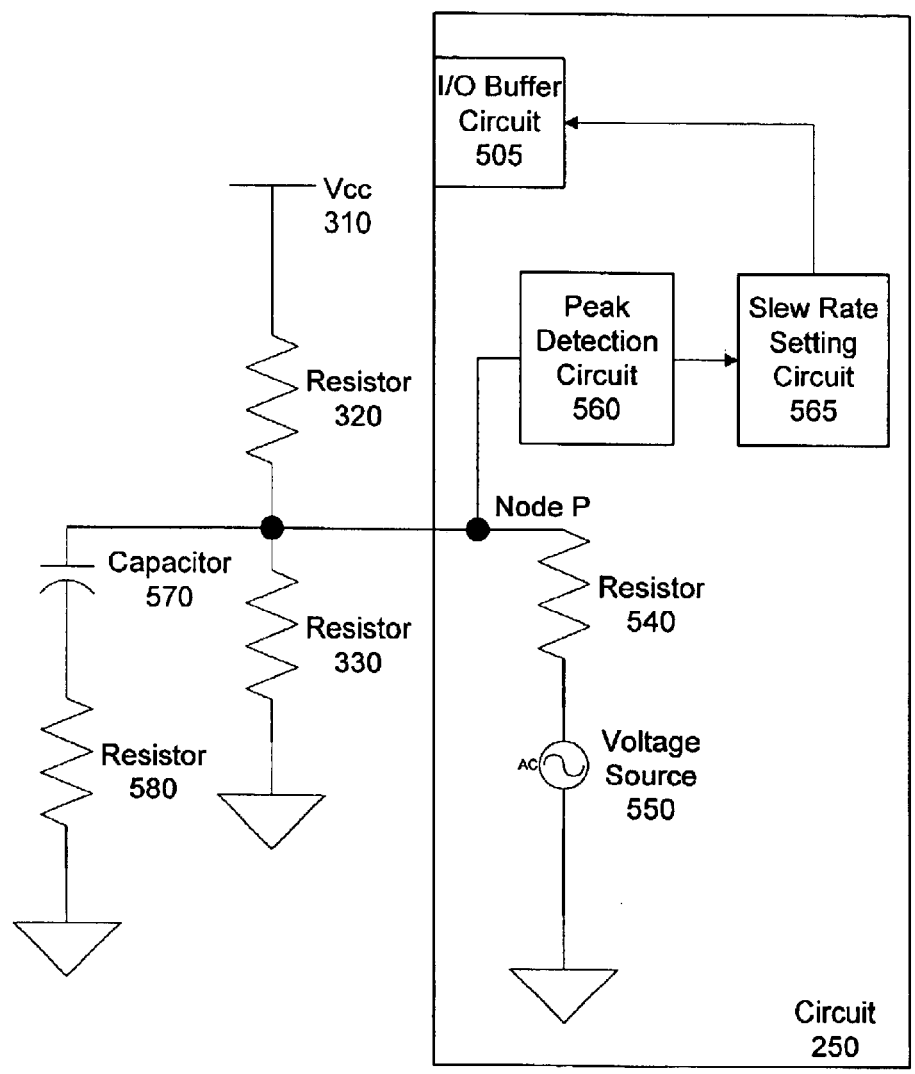
FIG. 5 shows one embodiment of a circuit for setting a third parameter.

FIG. 5 depicts an embodiment of a circuit 250 for setting a third parameter of IC 200. The circuit 250 comprises a peak detection circuit 560 coupled to slew rate setting circuit 565, resistor 540, and an external circuit. The resistor 540 is coupled to an AC voltage source 550. The slew setting circuit 565 is coupled to an I/O buffer circuit 505. The external circuit may comprise Vcc 310, resistor 320, resistor 330, capacitor 570, and resistor 580.

The peak detection circuit 560 calculates a peak voltage at node P. For one embodiment of the invention, voltage source 550 generates a pulsed signal having a maximum voltage of 0.5*Vcc and a minimum voltage of zero. Resistors 320 and 330 define the range of peak voltages achievable. The fundamental frequency of the pulsed signal is large enough so that the impedance of the capacitor 570 is sufficiently small compared to the resistors 320, 330, and 580. As a result, the following expression may apply, wherein resistor 320 is R1, resistor 330 is R2, the fundamental frequency of the pulsed signal generated by voltage source 550 is w, and capacitor 570 is C:

$$R1, R2 \gg \frac{1}{jwC}. \qquad \text{Equation 4}$$

Therefore, in an AC analysis, the resistor 580 appears in combination with resistors 320 and 330.

Because circuit 250 is a linear circuit that comprises both AC and DC components, the peak voltage (Vp) at node P may be calculated using superposition. Superposition involves algebraically adding the peak voltage due to the DC (Vp1) and the AC (Vp2) voltage sources. To solve for the DC equation, AC voltage source 550 is considered a short circuit having zero impedance, while the capacitor 570 operates as an open circuit having infinite impedance. The following equation may be derived using current analysis, wherein resistor 320 is R1, resistor 330 is R2, resistor 580 is R3, and resistor 540 is Rout:

$$\frac{Vcc - Vp1}{R1} = \frac{Vp1}{R2} + \frac{Vp1}{Rout}. \quad \text{Equation 5}$$

Equation 5 may be simplified and solved for Vp1 as follows:

$$\frac{Vcc}{R1} = Vp1\left(\frac{1}{R1} + \frac{1}{R2} + \frac{1}{Rout}\right) \quad \text{Equation 6}$$

$$Vp1 = Vcc\left(\frac{R2\|Rout}{R1 + R2\|Rout}\right). \quad \text{Equation 7}$$

To solve for the AC equation, the capacitor 570 is treated as a short circuit having zero impedance and Vcc is replaced by a short to ground. As stated above, the AC voltage source 550 fluctuates between zero and 0.5Vcc. The following equation may be obtained using current analysis:

$$\frac{0.5Vcc - Vp2}{Rout} = Vp2\left(\frac{1}{R1} + \frac{1}{R2} + \frac{1}{R3}\right). \quad \text{Equation 8}$$

Vp2 may then be calculated from equation 8:

$$Vp2 = 0.5Vcc\left(\frac{R1\|R2\|R3}{Rout + R1\|R2\|R3}\right). \quad \text{Equation 9}$$

The peak voltage, Vp, at node P may be obtained by adding Vp1 and Vp2:

$$Vp = Vcc\left(\frac{R2\|Rout}{R1 + R2\|Rout}\right) + 0.5Vcc\left(\frac{R1\|R2\|R3}{Rout + R1\|R2\|R3}\right). \quad \text{Equation 10}$$

Once peak detection circuit 560 detects the peak voltage at node P, a slew rate setting circuit may set a rise time of a signal transmitted by I/O buffer circuit 505. The slew rate setting circuit may be implemented as a lookup table that determines the slew rate given a peak voltage. For one embodiment of the invention, a range of peak voltage values map to a corresponding slew rate setting.

For another embodiment of the invention, the voltage source 550 may generate a maximum voltage value of 0.6*Vcc. The circuit 250, however, may have a limited feasibility voltage range for the voltage source 550 in order to maintain its linear characteristics. The feasibility voltage range may be a function of resistor 320, resistor 330, and resistor 540. The peak voltage is determined, in part, from resistor 580. As a result, the slew rate setting circuit 565 may define the feasible voltage range, which may thereby be used to determine a suitable value for resistor 580. For example, if resistor 320 is 40 ohms, resistor 330 is 200 ohms, and resistor 540 is 50 ohms, the slew rate setting circuit 565 may define the feasible voltage range to be between 0.5Vcc and 0.7Vcc. If a peak voltage of 0.6Vcc is desired, then the user may choose resistor 580 to be approximately 20 ohms based on equation 10.

Successive parameters may incorporate more reference errors due to component tolerances. Therefore, it may be desirable to set the most crucial parameter first to minimize the programming components. The less crucial parameters may then be subsequently set.

In the foregoing specification the invention has been described with reference to specific exemplary embodiments thereof. It will, however, be evident that various modifications and changes may be made thereto without departure from the broader spirit and scope of the invention as set forth in the appended claims. The specification and drawings are, accordingly, to be regarded in an illustrative rather than restrictive sense.

What is claimed is:

1. A system, comprising:
   an external circuit; and
   an integrated circuit (IC) having an IC terminal, wherein the IC terminal couples the IC to the external circuit, wherein the IC terminal is used to set a first and a second parameter of the IC, wherein the IC comprises
   a first circuit to determine the value of the first parameter,
   a second circuit to determine the value of the second parameter, and
   a third circuit that determines the value of a third parameter.

2. The system of claim 1, further comprising:
   a switch, wherein the switch couples the first circuit to the external circuit to set the first parameter.

3. The system of claim 1, wherein the IC comprises an internal circuit that determines the value of the first and second parameters.

4. The system of claim 1, wherein the first circuit comprises a differential amplifier that compares a voltage as received at the IC terminal with a reference voltage and generates an output value, wherein a logic circuit coupled to the differential amplifier sets the first parameter based on the output value.

5. A method, comprising:
   coupling an external circuit having a DC Thevenin equivalent circuit to a terminal of an integrated circuit (IC); and
   using the Thevenin voltage and resistance of the external circuit to set two parameters in the IC, wherein the external circuit has an AC Thevenin equivalent circuit used to set a third parameter in the IC.

6. A method, comprising:
   coupling a first resistor and a second resistor to a first circuit on an integrated circuit (IC) through an IC terminal;
   using the first circuit to set a first parameter of the IC;
   coupling the first resistor and the second resistor to a second circuit on the IC through the IC terminal; and
   using the second circuit to set a second parameter of the IC.

7. The method of claim 6, further comprising:
   setting the first parameter by solving an equation that is a function of the first resistor and the second resistor.

8. The method of claim 6, further comprising:
   setting the second parameter by solving an equation that is a function of the first resistor, the second resistor, and the first parameter.

9. The method of claim 6, further comprising:
   coupling the first resistor, the second resistor, a third resistor, and a capacitor to a third circuit on the IC through the IC terminal; and
   using the third circuit to set a third parameter of the IC.

10. The method of claim 9, wherein the third circuit uses a lookup table to set the third parameter.

11. An integrated circuit (IC), comprising:
    means for setting a termination resistance of the IC using an IC terminal;
    means for setting an equalization current of the IC using the IC terminal;

means for setting a peak voltage of the IC using the IC terminal.

12. An integrated circuit (IC), comprising:
an IC terminal to couple the IC to an external circuit; and
an internal circuit coupled to the IC terminal, wherein the internal circuit sets a first parameter and a second parameter of the IC, wherein the internal circuit sets a third parameter of the IC.

13. The IC of claim 12, wherein the first parameter is a termination resistance.

14. The IC of claim 12, wherein the IC terminal is a pin.

15. The IC of claim 12, wherein the IC terminal is a bump.

16. An integrated circuit (IC), comprising:
an IC terminal to couple the IC to an external circuit; and
an internal circuit coupled to the IC terminal, wherein the internal circuit sets a first parameter and a second parameter of the IC, wherein the second parameter is an equalization current.

17. An integrated circuit (IC), comprising:
an IC terminal to couple the IC to an external circuit; and
an internal circuit coupled to the IC terminal, wherein the internal circuit sets a first parameter, a second parameter and a third parameter of the IC, wherein the third parameter is a rise time.

18. An integrated circuit (IC), comprising:
a pin coupled to a first external resistor (R1), a second external resistor (R2), and a voltage source (Vcc);
a termination resistor (RT) coupled to the pin;
a differential amplifier coupled to the termination resistor, wherein the differential amplifier has a reference voltage input (xVcc); and
a first circuit coupled to the differential amplifier, wherein the first circuit sets the termination resistance such that the expression: $[(R2*RT)/(R1*R2+R1*RT+R2*RT)]*Vcc=xVcc$ is satisfied.

19. The IC of claim 18, further comprising:
a second circuit coupled to the pin, wherein the second circuit sets an equalization current (Ieq) of a current source such that the expression: $[R2/(R1+R2)]*Vcc=Vcc-RT*Ieq$ is satisfied.

20. The IC of claim 19, further comprising:
a third circuit coupled to the pin, wherein the third circuit sets a rise time of an input/output buffer circuit based upon a peak voltage (Vp) measured at the pin.

21. The IC of claim 20, wherein the Vp is obtained by adding a DC voltage component and an AC voltage component.

22. The IC of claim 20, wherein the rise time as a function of Vp is set using a lookup table.

23. The IC of claim 20, wherein the rise time as a function of Vp is set using a translation circuitry.

24. The IC of claim 21, further comprising:
a capacitor coupled to the pin;
a third external resistor (R3) coupled to the capacitor; and
an internal resistor (Rout) coupled to the pin, wherein the expression: $Vp=Vcc*[(R2*Rout)/(R1*R2+R1*Rout+R2*Rout)]+0.5Vcc*[(R1*R2*R3)/(R1*R2*R3+R1*R2*Rout+R2*R3*Rout+R2*R3*Rout)]$ is satisfied.

* * * * *